United States Patent
Shu et al.

(10) Patent No.: US 10,048,338 B2
(45) Date of Patent: Aug. 14, 2018

(54) SYSTEMS AND METHODS FOR EFFICIENTLY GENERATING MAGNETIC RESONANCE IMAGES FROM INCOMPLETE DATA

(71) Applicants: Yunhong Shu, Rochester, MN (US); Armando Manduca, Rochester, MN (US); Joshua D. Trzasko, Rochester, MN (US); Matthew A. Bernstein, Rochester, MN (US)

(72) Inventors: Yunhong Shu, Rochester, MN (US); Armando Manduca, Rochester, MN (US); Joshua D. Trzasko, Rochester, MN (US); Matthew A. Bernstein, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 746 days.

(21) Appl. No.: 14/694,621

(22) Filed: Apr. 23, 2015

(65) Prior Publication Data

US 2015/0309136 A1    Oct. 29, 2015

Related U.S. Application Data

(60) Provisional application No. 61/984,284, filed on Apr. 25, 2014.

(51) Int. Cl.
*G01R 33/48* (2006.01)
*G01R 33/561* (2006.01)

(52) U.S. Cl.
CPC ...... *G01R 33/4826* (2013.01); *G01R 33/5611* (2013.01)

(58) Field of Classification Search
USPC .............. 324/300–322, 202; 600/407–435; 382/128–131
See application file for complete search history.

(56) References Cited

U.S. PATENT DOCUMENTS

| 7,275,008 | B2 * | 9/2007 | Plyvanainen | G01C 17/38 324/202 |
|---|---|---|---|---|
| 8,410,780 | B2 * | 4/2013 | Cochrane | G01R 33/60 324/310 |
| 9,336,611 | B2 * | 5/2016 | Bilgic | A61B 5/055 |
| 2007/0055468 | A1 * | 3/2007 | Pylvanainen | G01C 17/38 702/92 |
| 2010/0066366 | A1 * | 3/2010 | Cochrane | G01R 33/56 324/310 |

(Continued)

*Primary Examiner* — Melissa Koval
*Assistant Examiner* — Tiffany Fetzner
(74) *Attorney, Agent, or Firm* — Quarles & Brady LLP

(57) ABSTRACT

Systems and methods for efficiently generating MR images are provided. The method comprises acquiring k-space MR data, reconstructing an MR image from the k-space MR data, and generating the MR image. The MR image is reconstructed using an alternative-direction-method-of-multiplier (ADMM) strategy that decomposes an optimization problem into subproblems, and at least one of the subproblems is further decomposed into small problems. The further decomposition is based on Woodbury matrix identity and uses a diagonal preconditioner based on non-Toeplitz models.

9 Claims, 6 Drawing Sheets

(56) References Cited

U.S. PATENT DOCUMENTS

| | | | |
|---|---|---|---|
| 2013/0188854 A1* | 7/2013 | Bilgic | A61B 5/055 382/131 |
| 2015/0003706 A1* | 1/2015 | Eftestol | G06T 7/0012 382/131 |
| 2015/0309136 A1* | 10/2015 | Shu | G01R 33/4826 324/309 |
| 2016/0253825 A1* | 9/2016 | Trzasko | G01R 33/5608 382/131 |

* cited by examiner

SYSTEMS AND METHODS FOR EFFICIENTLY GENERATING MAGNETIC RESONANCE IMAGES FROM INCOMPLETE DATA

CROSS-REFERENCE TO RELATED APPLICATIONS

This application is based on, claims priority to, and incorporates herein by reference in its entirety, U.S. Provisional Patent Application Ser. No. 61/984,284, filed on Apr. 25, 2014, and entitled "Preconditioned Optimization Strategy for Medical Image Reconstruction."

BACKGROUND

Relatively-long scan time remains as the major drawback of magnetic resonance imaging (MRI), compared to other medical imaging modalities like ultrasound and computed tomography. To reduce scan time, in accelerated MRI, significantly fewer magnetic resonance imaging measurements than traditionally though necessary are acquired. In reconstructing images acquired with accelerated MRI, promoting sparsity during image reconstruction—such as compressed sensing—has emerged as a powerful technique for improving signal-to-noise ratio and suppressing undersampling artifact. However, sparse reconstruction of non-Cartesian MRI data remains computationally challenging because multiple "gridding" operations must be executed at each iteration of the reconstruction.

It would be desirable to have a system and method for efficiently generating MR images in accelerated MRI while still promoting the sparsity in acquisition.

SUMMARY

The present disclosure provides systems and methods that overcome the aforementioned drawbacks by efficiently generating magnetic resonance (MR) images in accelerated magnetic resonance imaging (MRI). The method may use an alternative-direction-method-of-multiplier (ADMM) strategy to decompose an optimization problem in compressed sensing into subproblems. At least one of the subproblems may be further decomposed based on Woodbury matrix identity and using a diagonal preconditioner based on non-Toeplitz models.

In accordance with one aspect of the disclosure, a methods is provided for efficiently generating MR images. The method comprises acquiring k-space MR data, reconstructing an MR image from the k-space MR data, and generating the MR image. The MR image is reconstructed using an alternative-direction-method-of-multiplier (ADMM) strategy that decomposes an optimization problem into subproblems, and at least one of the subproblems is further decomposed into small problems. The further decomposition is based on Woodbury matrix identity and uses a diagonal preconditioner based on non-Toeplitz models.

In accordance with another aspect of the disclosure, an MRI system is provided. The MRI system includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive MR signals therefrom and a computer system. The computer system is programmed to control the gradient system and the RF system to acquire k-space MR data, reconstruct an MR image from the k-space MR data, and generate the MR image. The MR image is reconstructed using an ADMM strategy that decomposes an optimization problem into subproblems, and at least one of the subproblems is further decomposed into small problems. The further decomposition is based on Woodbury matrix identity and uses a diagonal preconditioner based on non-Toeplitz models.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
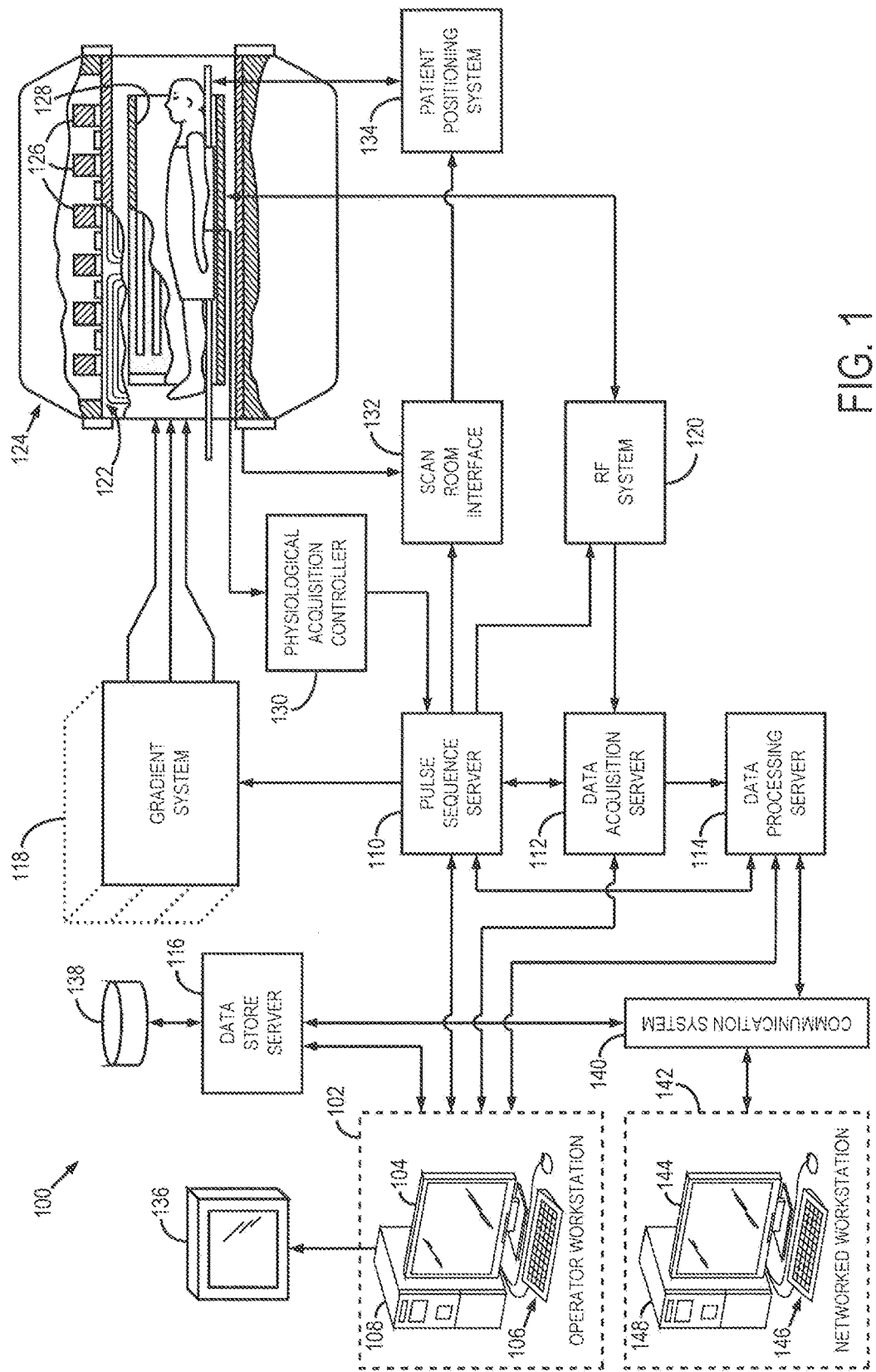
FIG. 1 is a block diagram of an example of a magnetic resonance imaging ("MRI") system.

Systems and methods for generating magnetic resonance (MR) images with improved image quality and less computation time from k-space MR data acquired with accelerated magnetic resonance imaging (MRI) are provided. Accelerated MRI is an MRI technique that acquires significantly less measurements than traditional thought necessary so to reduce scan time in MRI.

One way to reconstruct an MR image from k-space data acquired with accelerating MRI is compressed sensing (CS) reconstruction. Many classes of MR images are sparse or compressible—i.e., containing substantial data redundancies—intrinsically or in some transform domain. For example, contrast-enhanced MR angiography data is sparse after finite difference or wavelet spatial transformation. CS methods actively promote this sparsity property during image reconstruction using optimization penalties (i.e., regularization) or constraints.

A CS-based image reconstruction problem can be solved by a variety of numerical optimization techniques, such as projected gradient descent, nonlinear conjugate gradient iteration, interior point, and primal-dual methods. Although there are techniques that are applicable for reconstructing MR images from non-Cartesian data, and can be modified to account for data non-idealities like off-resonance induced blurring, it is challenging to make those techniques computationally efficient. This is due to the complex algebraic structure associated with data fidelity enforcement on data that does not lie on a regular (i.e., Cartesian) grid. Moreover, the presence of off-resonance effects in the MRI signals eliminates regular algebraic structure, and thus precludes use of standard preconditioning methods that are otherwise regularly used in many fields to improve efficiency in solving numerical problems.

An alternating-direction-method-of-multiplier (ADMM) strategy eases the problem by decomposing the optimization problem into subproblems—relatively easier ones—and solving the subproblems serially. Because of this, ADMM methods are increasingly being used in a wide range of computational applications, both in and outside of medical imaging. For non-Cartesian MRI, the data fidelity subproblem must also be solved iteratively, e.g., via conjugate gradient (CG) iteration. If off-resonance effects are included into the MRI signal model for data acquired with non-Cartesian scanning trajectory—e.g., to avoid geometric distortion, again standard circulant preconditioners (PC) cannot be used to accelerate one of the subproblems decomposed by an ADMM strategy. This is because the Gram matrix constructed from the sampling operator is not Toeplitz. As a result, the practicality of ADMM for non-Cartesian MRI is limited.

The systems and methods disclosed herein decompose at least one of the subproblems further into small problems. One of the small problems allows the use of simple but effective diagonal PCs for non-Toeplitz models. The system and methods disclosed herein can efficiently reconstruct images from non-Cartesian MR data with improved image quality.

Referring particularly to FIG. 1, an example of an MRI system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 (or specialized RF coils such as a head and neck or a knee coil, for example).

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. The whole-body RF coil 128 or one or more local coils or coil arrays can be used to receive RF signals. Each RF receiver channel includes an RF preamplifier that amplifies the MR signal received by the coil to which it is connected, and a detector that detects and digitizes the received MR signal. The magnitude of the received MR signal may be represented at any sampled point by the square root of the sum of the squares of the imaginary I and real Q components:

$$M=\sqrt{I^2+Q^2},$$

and the phase of the received MR signal may also be determined:

$$\varphi = \tan^{-1}\left(\frac{Q}{I}\right).$$

The pulse sequence server 110 also optionally receives patient data from a physiological acquisition controller 130. The controller 130 receives signals from a number of different sensors connected to the patient, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processing server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 104 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communication system 140 and networked workstation 142 may represent any of the variety of local and remote computer systems that may be included within a given clinical or research facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2:
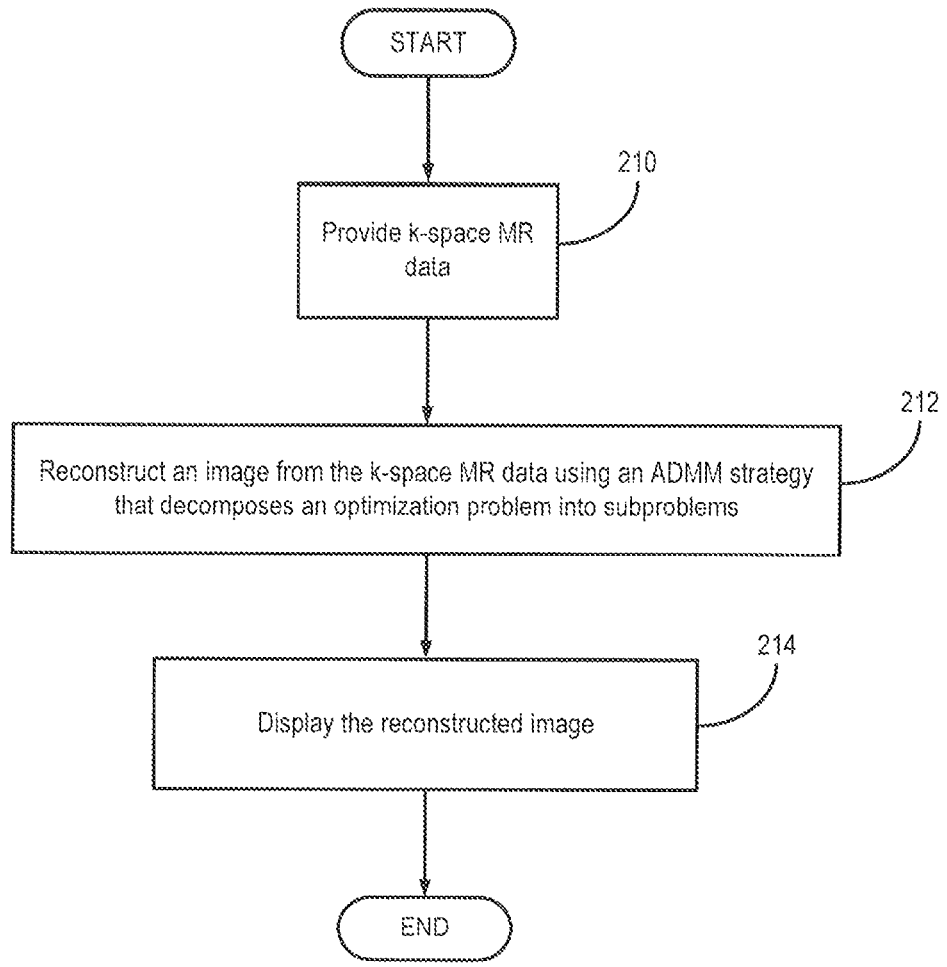
FIG. 2 is a flow chart representing the steps of an example method implemented according to the present disclosure.

Referring now to FIG. 2, a flow chart of an example method implemented according to the present application is provided. In step 210, k-space MR image data is acquired. The data can be acquired from an MRI system or a data storage by receiving, selecting, uploading, downloading, copying, or other similar action with respect to the data.

In step 212, an MR image is reconstructed from the k-space MR image data using an ADMM strategy. The ADMM strategy decomposes an optimization problem. More particularly, presuming a Dirac delta voxel model, MRI acquisition can be modeled as:

$$g = Af + n \quad [1],$$

where g is the set of measured signals, A is a Fourier-based sampling operator that includes off-resonance effects, f is the set of target images, and n is complex Gaussian noise.

Sparse MRI reconstruction can be represented as solving the following optimization problem:

$$[\hat{f}] = \arg\min_f \{ J(f) \triangleq R(f) + \|Af - g\|_2^2 \} \quad [2],$$

where J(f) is an objective function, and R(·) is a sparsity penalty. The augmented Lagrangian method is a method to solve this optimization problem, where the objective function is added with a term designed to mimic a Lagrange multiplier. So the augmented Lagrangian functional—or the objective function—in an augmented Lagrangian method is:

$$L(f, v, \eta) = R(v) + \|Af - g\|_2^2 + \mu \|v - f - \eta\|_2^2 \quad [3],$$

where $\mu > 0$ is a user-selected parameter, and $\eta$ is a Lagrange multiplier vector.

Figure 3A:
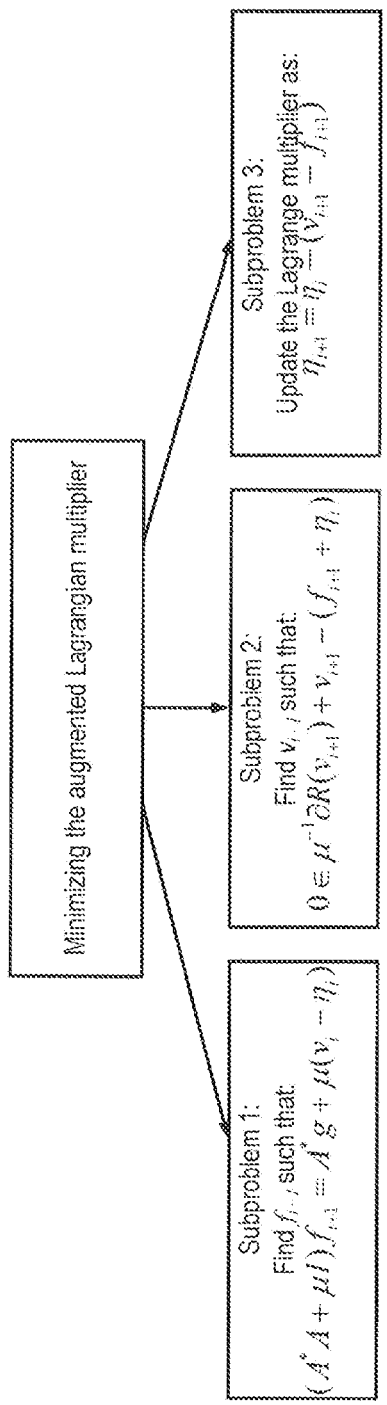
FIG. 3(A) shows a standard alternating-direction-method-of-multiplier (ADMM) scheme.
Figure 3B:
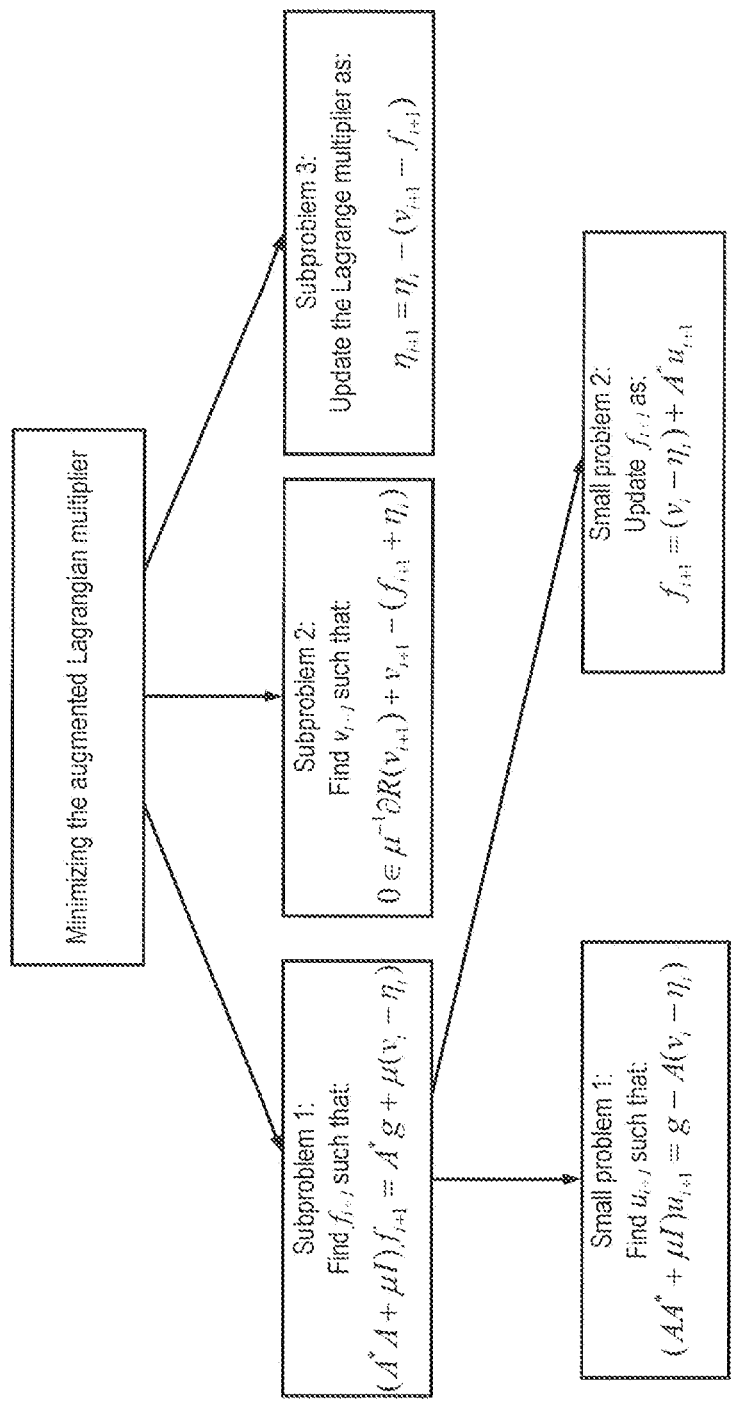
FIG. 3(B) shows a Woodbury ADMM scheme.

ADMM eases the optimization problem by decomposing the augmented Lagrangian functional into subproblems that can be minimized serially. Referring to FIGS. 3A and 3B, a schematic depiction of the regular ADMM scheme and that of an example method implemented according to the present application are provided. The regular ADMM scheme is shown in FIG. 3(A). In regular ADMM, the optimization problem can be divided into three subproblems. The first one is to find a $f_{i+1}$ such that:

$$(A^*A + \mu I)f_{i+1} = A^*g + \mu(v_i - \eta_i) \quad [4],$$

where I is a unity matrix. The second subproblem is to find $v_{i+1}$ such that:

$$0 \in \mu^{-1} \partial R(v_{i+1}) + v_{i+1} - (f_{i+1} + \eta_i) \quad [5].$$

The last subproblem is to update the Lagrange multiplier as $$\eta_{i+1} = \eta_i - (v_{i+1} - f_{i+1}) \quad [6].$$

For standard sparsity penalties, the second subproblem can be directly solved, e.g., via soft thresholding; and the last subproblem of updating the Lagrange multiplier is trivial. As for the first subproblem, although it is linear, it must be solved iteratively due to its size and structure. Because $A^*A + \mu I$ is not Toeplitz, standard circulant PC cannot be used to accelerate the process of solving the first subproblem.

However, via Woodbury matrix identity:

$$(B + UCV)^{-1} = B^{-1} - B^{-1}U(C^{-1} + VB^{-1}U)^{-1}VB^{-1} \quad [7],$$

where B, U, C, V denote matrices, $f_{i+1}$ can be expressed as:

$$f_{i+1} = (A^*A + \mu I)^{-1}[A^*g + \mu(v_i - \eta_i)] = (v_i - \eta_i) + A^*(AA^* + \mu I)^{-1}[g - A(v_i - \eta_i)] \quad [8].$$

Now the first subproblem can be further decomposed into two small problems as shown in FIG. 3(B). The first small problem is to find a $u_{i+1}$ such that $$(AA^* + \mu I)u_{i+1} = g - A(v_i - \eta_i) \quad [9].$$

The second small problem is to update $f_{i+1}$ as:

$$f_{i+1} = (v_i - \eta_i) + A^*u_{i+1} \quad [10].$$

For non-iterative gridding, reconstruction can be implemented as $\hat{f} = A^*Dg$, where $D \approx (AA^*)^{-1}$—density compensation function (DCF)—is a positive definite diagonal matrix. So, for the first small problem expressed in Eq. [9] and shown in FIG. 3(B), diagonal PCs of the form $P = (D^{-1} + \mu I)^{-1}$ can be used. This approach does not alter statistical objective and therefore imposes no penalty to signal-to-noise ratio.

In one configuration, J(f) is defined with a joint sparsity penalty as $R(u) = \lambda \|\Psi u\|_{1,2}$, $\Psi$=4-tap 3D Daubechies wavelet and A is implemented as a time-segmented (L=8 segments, filter=Hann window) non-uniform fast Fourier transform (NUFFT) (oversampling factor OF=1.25×, width W=5 Kaiser-Bessel kernel). At each iteration of a Woodbury ADMM method, the first subproblem can be solved (inexactly) via a single warm-started CG iteration, and $\mu$ is set to yield condition number $\kappa$=100. D may be designed with a method such as described in Shu et al., ISMRM 2011:2656, which is incorporated herein by reference in its entirety. The method using Woodbury matrix identity and an ADMM strategy with a PC (Woodbury ADMM with PC) may be compared with other reconstruction methods—such as gridding, standard ADMM, the method using Woodbury matrix identity and an ADMM strategy but without a PC (Woodbury ADMM without PC), and fast iterative shrinkage-thresholding algorithm (FISTA)—in terms of image quality and the convergence rate as a function of iteration and processor time. Example k-space data set is a 3.35× undersampled SWIRLS 3D CE-MRA (shells with integrated radial lines and spirals and three-dimensional contrast enhanced-magnetic resonance angiography) data set (240× 240×240, 8-channel, field map acquired with a separate scan).

Figures 4A, 4B:
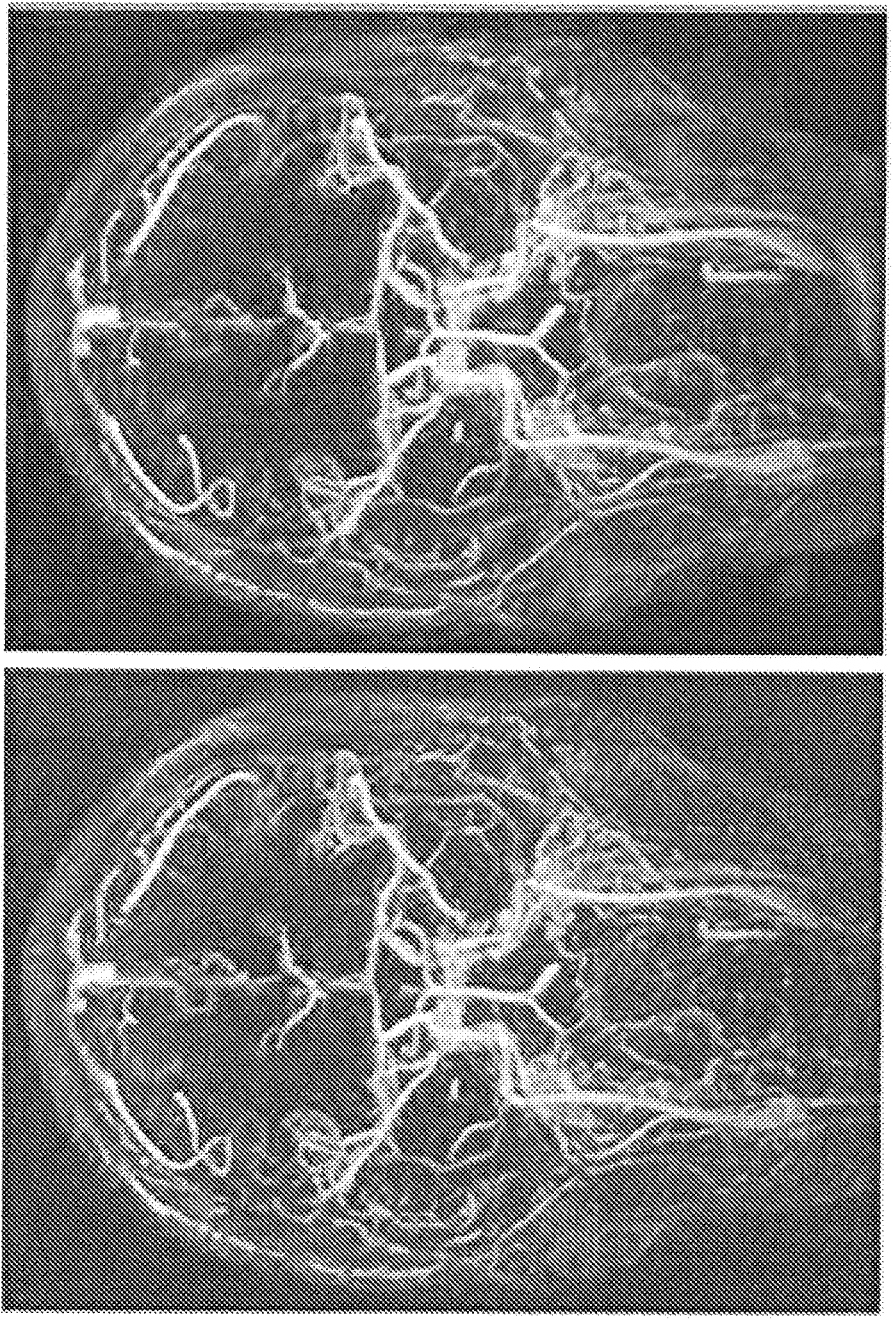
FIG. 4(A) is an angiographic image displayed with a maximum intensity projection (MIP) algorithm, where the image is reconstructed from k-space MR data acquired with shells with integrated radial lines and spirals (SWIRLS) 3D CE-MRA and three-dimensional contrast enhanced-magnetic resonance angiography) using gridding.
FIG. 4(B) is an MIP angiographic image reconstructed from the same k-space MR data as that of FIG. 4(A), but using a ADMM Woodbury with preconditioner scheme.
Figure 5A:
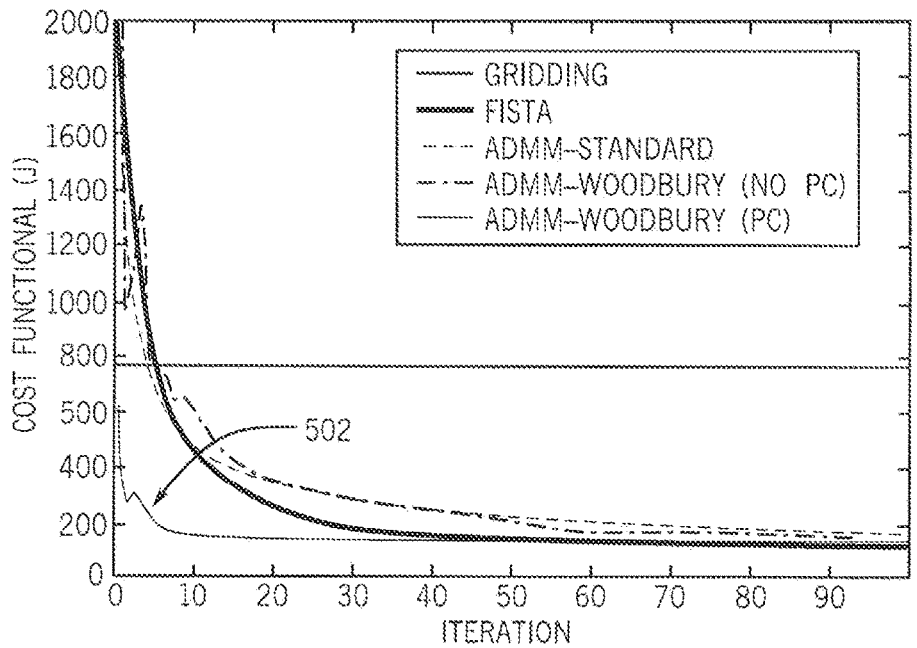
FIG. 5(A) compares convergence rates of reconstruction methods as a function of iteration.
Figure 5B:
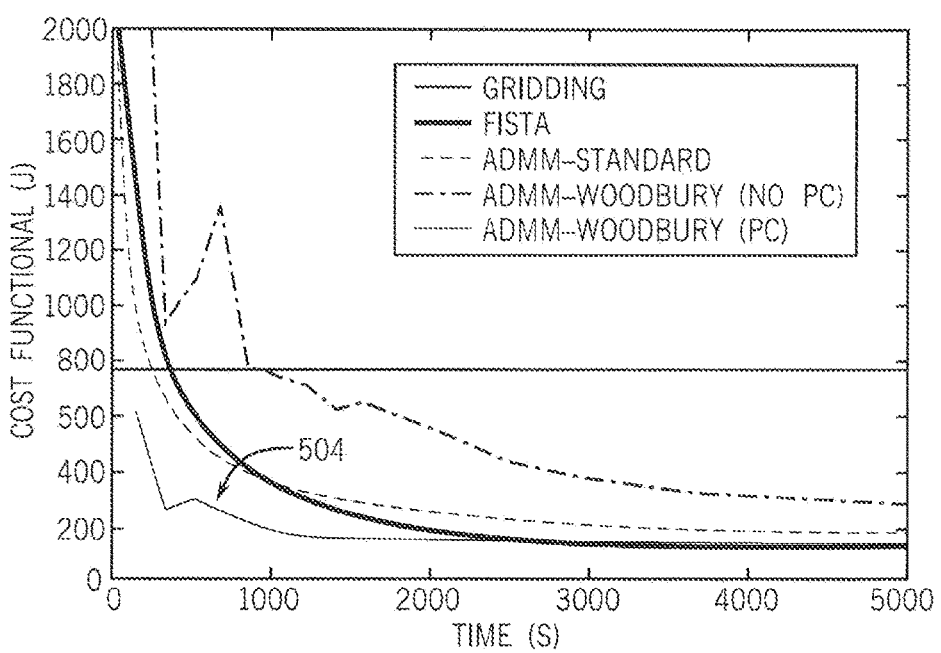
FIG. 5(B) compares the convergence rates as a function of computation time.

Referring again to FIG. 2, in step 214, the reconstructed image can be displayed. The image can be displayed on a display unit, stored in an image database, or sent to a machine for printing on a film. Images of the example data are shown in FIGS. 4(A) and 4(B). FIG. 4(A) shows the reconstructed image using gridding. FIG. 4(B) shows the reconstructed image using Woodbury ADMM with PC. The method disclosed herein improves image quality over the method of gridding and is more efficient than other methods. Plots of the optimization objective, J(f), versus iteration number and processor (CPU) time are shown in FIGS. 5(A) and 5(B). As shown in FIG. 5(A), the Woodbury with PC method (marked by arrow 502) converge much faster than other methods. Also, as shown in FIG. 5(B), while achieving similar or better image quality in the reconstructed image, the Woodbury ADMM with PC method (marked with arrow 504) exhibits a 10× improvement in runtime performance over Woodbury ADMM without PC method, 3.5× over standard ADMM, and 2.5× over FISTA.

A person skilled in the art would appreciate that the systems and methods as disclosed herein can be used to generate images from k-space data acquired with other non-Cartesian MRI acquisition trajectories, and also can be combined with other reconstruction models that include parallel imaging or other regularization strategies—e.g., low-rank regularization strategy.

Therefore, systems and methods have been described for efficiently generating MR images. The method comprises acquiring k-space MR data, reconstructing an MR image from the k-space MR data, and generating the MR image. The MR image is reconstructed using an ADMM strategy that decomposes an optimization problem into subproblems, and at least one of the subproblems is further decomposed into small problems. The further decomposition is based on Woodbury matrix identity and uses a diagonal preconditioner based on non-Toeplitz models. In one configuration, the k-space MR data is acquired with a non-Cartesian scanning trajectory. In another configuration, a diagonal PC of form $P=(D^{-1}+\mu I)^{-1}$ is used, where $D \approx (AA^*)^{-1}$, A is a Fourier-based sampling operator that includes off-resonance effects, I is an identify matrix, and $\mu$ is a user-selected parameter.

Off-resonance correction is an important part of non-Cartesian imaging, and is requisite for practical clinical utility. For example, in 3D CE-MRA of the neurovasculature, uncorrected off-resonance effects resulting from susceptibility at the air-tissue interface in the nasal cavity can induce significant blurring of the anterior cerebral arteries. Non-Cartesian image reconstruction, especially within an iterative framework required for CS applications, is already computationally challenging. When off-resonance correction is incorporated, non-Cartesian reconstruction can become too complex to be tolerated within a standard clinical workflow. The Woodbury ADMM strategy with preconditioning can significantly reduce the overall computational cost of CS-type reconstructions for non-Cartesian MRI data with off-resonance correction, and allows practical clinical use of CS technology for non-Cartesian MRI applications.

In accordance with another aspect of the disclosure, an MRI system is provided. The MRI system includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes an RF system configured to apply an RF field to the subject and to receive MR signals therefrom and a computer system. The computer system is programmed to control the gradient system and the RF system to acquire k-space MR data, reconstruct an MR image from the k-space MR data, and generate the MR image. The MR image is reconstructed using an ADMM strategy that decomposes an optimization problem into subproblems, and at least one of the subproblems is further decomposed into small problems. The further decomposition is based on Woodbury matrix identity and uses a diagonal preconditioner based on non-Toeplitz models. In one configuration, the k-space MR data is acquired with a non-Cartesian scanning trajectory. In another configuration, a diagonal PC of form $P=(D^{-1}+\mu I)^{-1}$ is used, where $D \approx (AA^*)^{-1}$, A is a Fourier-based sampling operator that includes off-resonance effects, I is an identify matrix, and $\mu$ is a user-selected parameter.

The present invention has been described in terms of one or more preferred embodiments, and it should be appreciated that many equivalents, alternatives, variations, and modifications, aside from those expressly stated, are possible and within the scope of the invention.

The invention claimed is:

1. A method of using a preconditioned optimization strategy in generating a magnetic resonance (MR) image with an accelerated compressed sensing reconstruction, the method comprising:
   a) acquiring k-space MR data with a magnetic resonance imaging system;
   b) reconstructing an MR image from the acquired k-space, with an accelerated compressed sensing reconstruction process that utilizes a computer processor in communication with the magnetic resonance imaging system by:
      i) implementing the use of an alternative-direction-method-of-multiplier (ADMM) strategy in the reconstruction of the generated MR image that initially decomposes the optimization of the ADMM strategy into sub problems before reconstructing the MR image with the computer processor in communication with the magnetic resonance imaging system;
      ii) after completing step i), further decomposing at least one of the subproblems of step i) by the use of a Woodbury matrix identity having a diagonal preconditioner (PC) that is based on non-Toeplitz matrix models and
      iii) after completing step ii), solving each of the decomposed sub problems with the computer processor in communication with the magnetic resonance imaging system,
      whereby the accelerated compressed sensing reconstruction process of steps i), ii) and iii) are utilized in order to generate, provide on a display, and/or store in a memory, the magnetic resonance image resulting from performing this Woodbury preconditioned ADMM optimization strategy.

2. The method of claim 1, wherein the k-space MR data is acquired, by the magnetic resonance imaging system, with a non-Cartesian scanning trajectory.

3. The method of claim 1, wherein the diagonal PC has a mathematically written form of $P=(D^{-1}+\mu I)^{-1}$, where $D \approx (AA^*)^{-1}$, A is a Fourier-based sampling operator that includes off-resonance effects, I is an identify matrix, and μ is a user-selected parameter.

4. A magnetic resonance imaging (MRI) system, comprising:
  a magnet system configured to generate a polarizing magnetic field around at least a portion of a subject arranged in the MRI system;
  a magnetic gradient system including a plurality of magnetic gradient coils configured to apply at least one magnetic gradient field onto the polarizing magnetic field;
  a radio frequency (RF) system configured to apply an RF field to the subject in the MRI system and to also receive magnetic resonance (MR) signals therefrom;
  a computer system programmed to:
  a) control the gradient system and the RF system in order to acquire k-space MR data with the magnetic resonance imaging system;
  b) reconstruct an MR image from the acquired k-space MR data with the computer processor of the magnetic resonance imaging system by:
    i) implementing the use of an alternative-direction-method-of-multiplier (ADMM) strategy in the reconstruction of the generated MR image that initially decomposes the optimization problem, of the ADMM strategy into subproblems, before reconstructing the MR image with the computer processor of the magnetic resonance imaging system;
    ii) wherein at least one of the subproblems of step i) is further decomposed after completing step i) by the use of a Woodbury matrix identity having a diagonal preconditioner (PC) that is based on non-Toeplitz matrix models and
    iii) after completing step ii), solving each of the decomposed sub problems with the computer processor, of the magnetic resonance imaging system,
    whereby steps i), ii) and iii) are utilized in order to generate, provide on a display, and/or store in a memory, the MR image resulting from performing this preconditioned Woodbury ADMM optimization strategy, as an output of the magnetic resonance imaging system.

5. The MRI system of claim 4, wherein the k-space MR data is acquired, by the magnetic resonance imaging system, with a non-Cartesian scanning trajectory.

6. The MRI system of claim 4, wherein the diagonal PC has a mathematically written form of $P=(D^{-1}+\mu I)^{-1}$, where $D \approx (AA^*)^{-1}$, A is a Fourier-based sampling operator that includes off-resonance effects, I is an identify matrix, and μ is a user-selected parameter.

7. A method of using an alternative-direction-method-of-multiplier (ADMM) strategy that decomposes the optimization into subproblems based on a Woodbury matrix identity using a diagonally preconditioned non-Toeplitz matrix model when generating a magnetic resonance (MR) image, with a magnetic resonance imaging system the method comprising:
  a) acquiring k-space MR data with the magnetic resonance imaging system;
  b) reconstructing an MR image from the acquired k-space MR data with the computer processor in communication with the magnetic resonance imaging system by:
    i) implementing the use of an alternative-direction-method-of-multiplier (ADMM) strategy in the reconstruction of the generated MR image that initially decomposes the optimization problem, of the ADMM strategy into subproblems, before reconstructing the MR image with the computer processor of the magnetic resonance imaging system;
    ii) wherein at least one of the subproblems of step i) is further decomposed after completing step i) by the use of a Woodbury matrix identity having a diagonal preconditioner (PC) that is based on non-Toeplitz matrix models; and
    iii) after completing step ii), solving each of the decomposed subproblems with the computer processor of the magnetic resonance imaging system, in order to generate, provide on a display, and/or store in a memory, the MR image resulting from performing this method using the magnetic resonance imaging system and the computer processor in communication with the magnetic resonance imaging system.

8. The MRI method of claim 7, wherein the k-space MR data is acquired, by the magnetic resonance imaging system, with a non-Cartesian scanning trajectory.

9. The MRI method of claim 7, wherein the diagonal PC has a mathematically written form of $P=(D^{-1}+\mu I)^{-1}$, where $D \approx (AA^*)^{-1}$, A is a Fourier-based sampling operator that includes off-resonance effects, I is an identify matrix, and μ is a user-selected parameter.

* * * * *